United States Patent
Humfeld et al.

(10) Patent No.: US 10,457,410 B2
(45) Date of Patent: Oct. 29, 2019

(54) MAGNETIC CARBON NANOTUBE CLUSTER SYSTEMS AND METHODS

(71) Applicant: The Boeing Company, Chicago, IL (US)

(72) Inventors: Keith Daniel Humfeld, Federal Way, WA (US); Morteza Safai, Newcastle, WA (US)

(73) Assignee: The Boeing Company, Chicago, IL (US)

( * ) Notice: Subject to any disclaimer, the term of this patent is extended or adjusted under 35 U.S.C. 154(b) by 653 days.

(21) Appl. No.: 15/140,386

(22) Filed: Apr. 27, 2016

(65) Prior Publication Data

US 2017/0313437 A1 Nov. 2, 2017

(51) Int. Cl.
| | | |
|---|---|---|
| *B64D 45/02* | (2006.01) | |
| *B64D 37/32* | (2006.01) | |
| *B64D 37/16* | (2006.01) | |
| *C23C 16/44* | (2006.01) | |
| *C01B 32/16* | (2017.01) | |
| *B64D 27/10* | (2006.01) | |

(52) U.S. Cl.
CPC ............. *B64D 45/02* (2013.01); *B64D 27/10* (2013.01); *B64D 37/16* (2013.01); *B64D 37/32* (2013.01); *C01B 32/16* (2017.08); *C23C 16/4417* (2013.01)

(58) Field of Classification Search
CPC ........ B64D 45/02; B64D 37/16; B64D 37/32; C01B 32/16
See application file for complete search history.

(56) References Cited

U.S. PATENT DOCUMENTS

| | | | |
|---|---|---|---|
| 8,541,155 B2 | 9/2013 | Uemura et al. | |
| 8,962,130 B2* | 2/2015 | Kruckenberg | B64D 45/02 428/297.4 |
| 2002/0192141 A1* | 12/2002 | Little | B82Y 30/00 423/447.1 |
| 2005/0062024 A1* | 3/2005 | Bessette | B82Y 30/00 252/500 |

(Continued)

OTHER PUBLICATIONS

Herrasti et al., "Electrochemical detection of dopamine using streptavidin-coated magnetic particles and carbon nanotube wiring," Sensors and Actuators B: Chemical, Jul. 12, 2014, pp. 891-898, Elsevier B.V., Amsterdam, Netherlands.

(Continued)

*Primary Examiner* — Justin M Benedik
(74) *Attorney, Agent, or Firm* — Haynes and Boone, LLP (57) ABSTRACT

Techniques are disclosed for systems and methods to provide magnetic carbon nanotube clusters configured to form electrically conductive coatings. A magnetic carbon nanotube cluster is formed by receiving a magnetic particle, forming a plurality of carbon nanotube catalyst nanoparticles on an outer surface of the magnetic particle, and forming a plurality of carbon nanotubes extending from the catalyst nanoparticles while the magnetic particle is levitated within a nanotube growth chamber to form the magnetic carbon nanotube cluster. A plurality of magnetic carbon nanotube clusters are suspended in a carrier fluid, the carrier fluid is flowed over a surface of an object, and a magnetic field is applied to the carrier fluid while it is flowing over the surface to cause the plurality of magnetic carbon nanotube clusters to form a coating on the surface of the object.

20 Claims, 8 Drawing Sheets

(56) References Cited

U.S. PATENT DOCUMENTS

| | | | | |
|---|---|---|---|---|
| 2007/0231521 | A1* | 10/2007 | Katayama | B32B 27/36 428/36.91 |
| 2008/0145528 | A1* | 6/2008 | Deng | B05D 1/60 427/180 |
| 2008/0286546 | A1* | 11/2008 | Lashmore | B01J 21/185 428/220 |
| 2009/0081441 | A1* | 3/2009 | Shah | B29C 70/081 428/222 |
| 2009/0176112 | A1* | 7/2009 | Kruckenberg | B82Y 30/00 428/457 |
| 2011/0017867 | A1* | 1/2011 | Simmons | C08J 5/24 244/1 A |
| 2011/0143087 | A1* | 6/2011 | Alberding | B82Y 30/00 428/114 |
| 2011/0186775 | A1* | 8/2011 | Shah | C08L 25/02 252/182.32 |

OTHER PUBLICATIONS

Boi et al., "Boundary layer chemical vapor synthesis of self-organized radial filled-carbon-nanotube structures," Carbon 64, Aug. 7, 2013, pp. 516-526, Elsevier Ltd., London, England.

Masotti et al., "Preparation of Magnetic Carbon Nanotubes (Mag-CNTs) for Biomedical and Biotechnological Applications," International Journal of Molecular Sciences, Dec. 18, 2013, pp. 24619-24642, vol. 14—No. 12, MDPI, Basel, Switzerland.

Saravanan et al., "Multiwalled Carbon Nanotube-Coated $SmCo_5$/Fe Magnetic Nanocomposites Processed by Magnetic Field-Assisted Ball Milling," Advanced Science Letters, 2010, pp. 87-92, vol. 3—No. 1, American Scientific Publishers, USA.

\* cited by examiner

MAGNETIC CARBON NANOTUBE CLUSTER SYSTEMS AND METHODS

TECHNICAL FIELD

The present application relates to carbon nanotubes, and more particularly, to carbon nanotube coatings and applications thereof.

BACKGROUND

Carbon nanotubes are typically individually electrically conductive, and a group of carbon nanotubes may be arranged to form an electrically conductive surface or coating. Conventionally, a coating of carbon nanotubes can be formed by flowing a colloidal suspension of carbon nanotubes over a particular surface and passively allowing the carbon nanotubes to adhere to the surface. However, such conventional methods often result in highly inhomogeneous coatings, particularly if the underlying surface is complex or otherwise causes disturbance in the flow of the colloidal suspension over the surface. Such conventional coatings generally cannot form a reliable electrically conductive coating on complex surfaces and are additionally unsuitable to eliminate electrostatic charge accumulation within or on such surfaces. Thus, there is a need in the art for a reliable method to form electrically conductive carbon nanotube coatings, particularly on complex surfaces.

SUMMARY

Techniques are disclosed for systems and methods to provide magnetic carbon nanotube clusters configured to form electrically conductive coatings. A magnetic carbon nanotube cluster (MCNC) may be formed by receiving a magnetic particle, forming a plurality of carbon nanotube catalyst nanoparticles on an outer surface of the magnetic particle, and forming a plurality of carbon nanotubes extending from the catalyst nanoparticles while the magnetic particle is levitated within a nanotube growth chamber to form the MCNC. In various embodiments, a plurality of MCNCs may be suspended in a carrier fluid, the carrier fluid may be flowed over a surface of an object, and a magnetic field may be applied to the carrier fluid while it is flowing over the surface to cause the plurality of MCNCs to form a coating on the surface of the object.

In one embodiment, a method for forming a magnetic carbon nanotube cluster (MCNC) includes receiving a magnetic particle, forming a plurality of carbon nanotube catalyst nanoparticles on an outer surface of the magnetic particle, and forming a plurality of carbon nanotubes extending from the catalyst nanoparticles while the magnetic particle is levitated within a nanotube growth chamber to form the MCNC.

In another embodiment, a method for applying MCNCs to a surface includes receiving a plurality of MCNCs suspended in a carrier fluid, flowing the carrier fluid over a surface of an object, and applying a magnetic field to the carrier fluid while it is flowing over the surface to cause the plurality of MCNCs to form a coating on the surface of the object.

In another embodiment, a device includes an object including a surface, and a coating of MCNCs formed on the surface, wherein each MCNC of the coating of MCNCs comprises a plurality of carbon nanotube catalyst nanoparticles formed on an outer surface of a magnetic particle and a plurality of carbon nanotubes extending from the catalyst nanoparticles and formed while the magnetic particle is levitated within a nanotube growth chamber.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting the same.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details or in variations of same. In some instances, structures and components are shown in block diagram form in order to avoid obscuring such concepts. In the drawings, the relative sizes of elements, layers, and regions may be exaggerated for clarity.

Fuel lines used for refueling aircraft are often made of polymeric material because of the material's durability and flexibility. The types of polymeric material used to form fuel lines (e.g., polyurethane, aquaporin elastomer, FKM fluoroelastomer, and/or other polymeric materials) is typically electrically non-conductive, and so such fuel lines can accumulate electrostatic charge on or within the inner surface of the line when the fuel line is coiled and uncoiled and particularly when fuel or other liquid or gas is flowed through the fuel line and over its inner surface, such as while refueling aircraft, other vehicles, and/or other combustion-based engines or generators.

To prevent or reduce the possibility of an inadvertent electrostatic discharge near a flammable liquid or gas, conventional polymeric fuel lines are grounded to both the fuel reservoir (e.g., a mobile tank or other refueling source) and the structure being refueled (e.g., an aircraft, other vehicle, and/or other structure including a combustion-based engine or generator). For example, a grounding connection or strap may be coupled between one end of the fuel line to grounding equipment at a refueling port on the aircraft, the refueling port may be grounded to grounding equipment at the fueling station using a separate grounding strap, and another grounding connection may be coupled between the other end of the fuel line to the same or different grounding equipment at the fueling station, all to avoid the risk electrostatic discharge. In order to facilitate such grounding, grounding equipment (conductive couplers, harnesses, and/or other grounding equipment) is typically permanently built into the aircraft or other structure, for example, such as into a refueling port integrated with the wing of the aircraft. This can significantly increase the complexity of the design of the refueling port and, with respect to aircraft, can increase the complexity of the wing design and can add significant weight, all of which increases the cost of manufacturing and operating the aircraft.

Embodiments of the present disclosure reduce or eliminate the need for such grounding by providing a reliable conductive coating on the internal surface of polymeric fuel lines, which can be configured to substantially block formation of localized electrostatic charge in or on the internal surfaces of polymeric fuel lines. In various embodiments, inner surfaces of a flexible fuel line (e.g., a duct or tube made of polymeric material) may be coated with electrically conductive carbon nanotubes to prevent buildup of electrostatic charge. For example, as disclosed herein, magnetic carbon nanotubes clusters (MCNCs) may be guided by a magnetic field to reliably coat complex or uneven (e.g., corrugated) inner surfaces of a flexible fuel line. Such fuel lines significantly simplify the design of the refueling port and the structure to be refueled because the grounding equipment does not have to be designed into the structure (e.g., an aircraft's wing and/or refueling port). That is, the structure may be designed to have a groundless refueling port. A polymeric fuel line that is both flexible and coated with an electrically conductive material is desirable for refueling aircraft and/or other structures because the flexibility, durability, and relatively low weight of the polymeric fuel line (e.g., relative to a metallic bellows or other metal fuel line) allows the operator to freely maneuver the fuel line from the fuel reservoir to the aircraft and easily store the fuel line when it is not in use, for example, by coiling and/or reeling the fuel line on a hose reel.

Conventional methods of forming carbon nanotubes include a chemical vapor deposition (CVD) growth process, where carbon nanotubes are grown from catalyst particles deposited on a relatively inert flat substrate. Another conventional CVD growth process for forming carbon nanotubes includes injecting catalyst particles directly into a carrier gas (e.g., a carbon ion carrier gas), and the carbon nanotubes are grown from the catalyst particles without a substrate. Carbon nanotubes formed according to such conventional methods generally cannot be physically manipulated or guided by easily generated (e.g., relatively low strength) magnetic fields.

Figure 1:
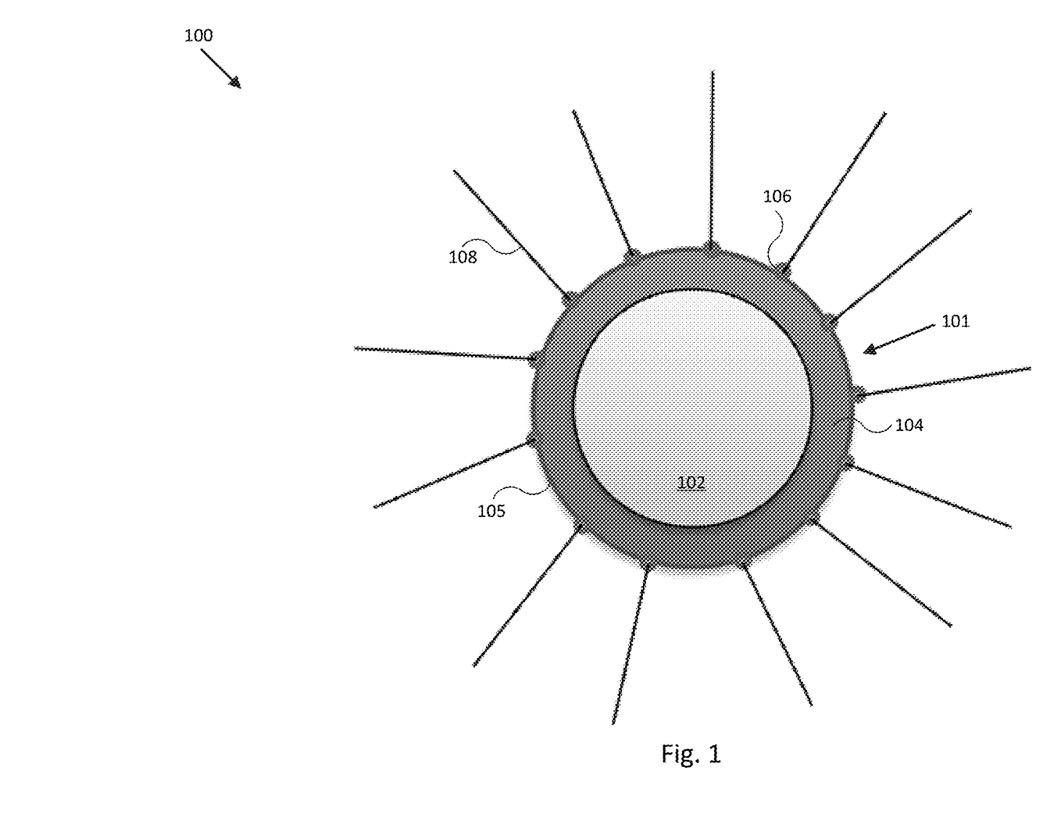
FIG. 1 illustrates a schematic diagram of a magnetic carbon nanotube cluster (MCNC), in accordance with an embodiment of the disclosure.

FIG. 1 shows a schematic diagram of an MCNC 100 according to an embodiment of the present disclosure. As shown in FIG. 1, MCNC 100 includes a magnetic particle 101, a plurality of carbon nanotube catalyst nanoparticles 106 on an outer surface 105 of magnetic particle 101, and a plurality of carbon nanotubes 108 extending from catalyst nanoparticles 106. By forming carbon nanotubes 108 linked to magnetic particle 101, embodiments of MCNC 100 may be moved or guided by an applied magnetic field to place carbon nanotubes 108 in a desired position on a surface to form a reliable electrically conductive coating.

In the embodiment shown in FIG. 1, magnetic particle 101 includes magnetic core 102 and intermediate layer 104. In other embodiments, magnetic particle 101 may include only magnetic core 102 and omit intermediate layer 104. Magnetic core 102 may be formed from samarium-cobalt, iron, and/or other hard or soft magnetic materials (e.g., where "hard" or "soft" refers to the magnetic coercivity of the material) that can be configured to couple to an applied magnetic field sufficiently to allow the applied magnetic field to change or maintain the position and/or orientation of MCNC 100, as described herein. For example, in various embodiments, such magnetic coupling must be strong enough to counteract gravity, the earth's magnetic field, and/or the drag of a carrier gas flowing around magnetic particle 101. Magnetic particle 101 and/or magnetic core 102 may be formed according to any shape, such as spherical, ellipsoidal, and/or parallelepiped, for example, which may be selected to couple to an applied magnetic field or gradient in a particular way to facilitate a type of physical movement of MCNC 100. In various embodiments, magnetic particle 101 and/or magnetic core 102 may be approximately 10 um in diameter. More generally, magnetic particle 101 and/or magnetic core 102 may range between approximately 5 um and 20 um or more in diameter, according to a desired magnetic interaction with an applied field and/or other MCNCs, for example, and/or a desired surface area of magnetic particle 101. In particular, magnetic core 102 must have a diameter larger than the typical minimum magnetic domain size for the material used to form magnetic core 102, and magnetic particle 101 typically has a diameter less than the length of carbon nanotubes 108.

Intermediate layer 104, when present, may be formed from any material able to facilitate the formation of carbon nanotube catalyst nanoparticles 106 on outer surface 105 of magnetic particle 101. In various embodiments, intermediate layer 104 may be formed from silica, aluminum oxide, various polymers, and/or other relatively inert insulators, or from a conductive material, for example, configured to form a material layer between magnetic core 102 and carbon nanotube catalyst nanoparticles 106 that is able to facilitate adhesion of carbon nanotube catalyst nanoparticles 106 to magnetic particle 101, such as via a Van der Waals force. In various embodiments, intermediate layer 104 may be deposited onto magnetic core 102 using a sputtering technique and/or other deposition process. In various embodiments, intermediate layer 104 may be at least approximately 20 nm thick. More generally, intermediate layer 104 may range between approximately 15 nm and 30 um or more in diameter, according to a desired reliable insulation of magnetic core 102 from catalyst nanoparticles 106, for example, or layer to which catalyst nanoparticles 106 may be reliably adhered to or embedded within. In embodiments where intermediate layer 104 is omitted, magnetic particle 101/ magnetic core 102 may be formed from a magnetic material configured to couple directly to carbon nanotube catalyst nanoparticles 106, such as via a Van der Waals force, for example, and facilitate preferential growth of carbon nanotubes 108 at catalyst nanoparticles 106.

Carbon nanotube catalyst nanoparticles 106 may be formed from titanium, cobalt, iron, molybdenum, nickel, yttrium, combinations or alloys of those, and/or any other material or alloy capable of providing a seed structure supporting chemical vapor deposition (CVD) growth and/or other type of growth of carbon nanotubes 108. For example, during CVD growth of carbon nanotubes 108 (e.g., in a suspended-catalyst reactor CVD chamber), carbon atoms/ions in a carrier gas may be presented to magnetic particle 101 and covalently bond to catalyst nanoparticles 106 to begin a chain of such bonds resulting in carbon nanotubes 108. In some embodiments, the material used to form catalyst nanoparticles 106 may be selected to impose a preferential type of chirality and/or other structural molecular characteristic on the resulting carbon nanotubes 108, which can be used to adjust collateral characteristics of carbon nanotubes 108. For example, adjusting the chirality of carbon nanotubes 108 may be used to adjust the conductivity of carbon nanotubes 108, among other properties. In various embodiments, carbon nanotube catalyst nanoparticles 106 may be approximately 5 nm in size and have a surface density on outer surface 105 of magnetic particle 101 of approximately $1 \times 10^9/cm^2$. More generally, carbon nanotube catalyst nanoparticles 106 may range between approximately 1 and 100 nm or more in size and approximately $1 \times 10^6/cm^2$ and $1 \times 10^{12}/cm^2$ or more in surface density on outer surface 101, according to a desired shape and density of carbon nanotubes 108, for example.

As generally shown in FIG. 1, in some embodiments, carbon nanotubes 108 may be grown so as to extend from catalyst nanoparticles 106 and away from outer surface 105 of magnetic particle 101 to form substantially straight or unbent nanotubes, for example, and/or in a direction generally normal to outer surface 105 of magnetic particle 101 at each position of catalyst nanoparticles 106. For example, as described more fully herein, the overall shape of carbon nanotubes 108 may be controlled through selection and placement of catalyst nanoparticles 106 on outer surface 105 of magnetic particle 101 and/or by controlling motion of magnetic particle 101 during the growth of catalyst nanoparticles 106.

Figure 2:
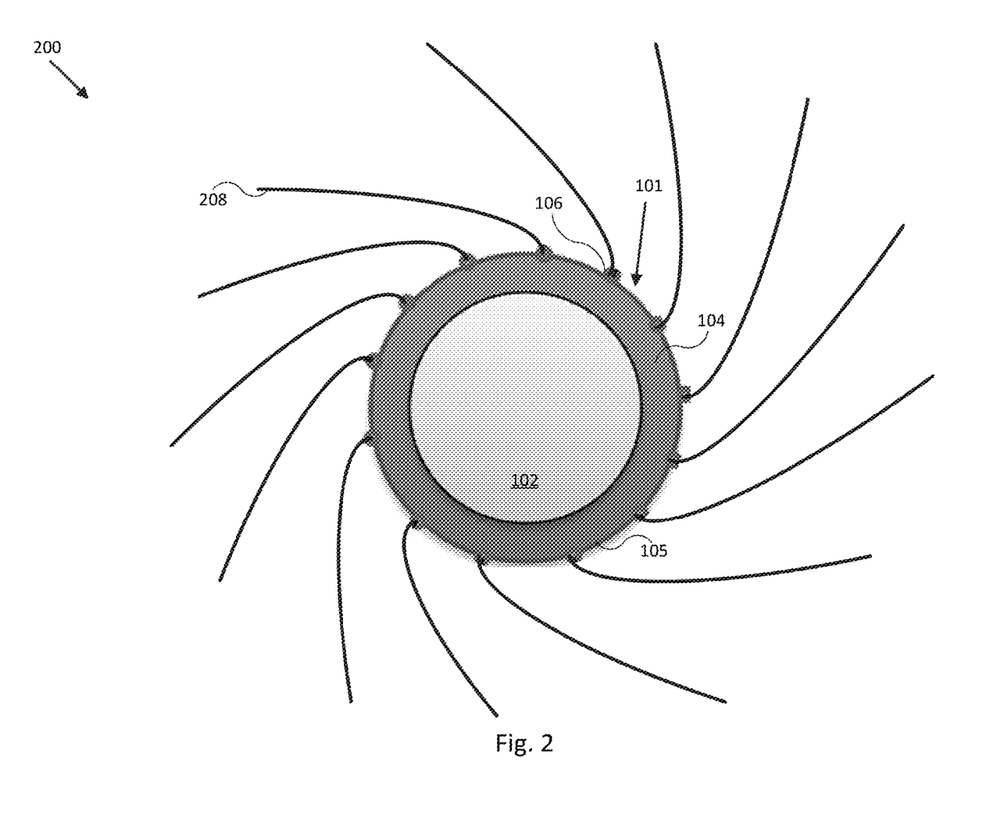
FIG. 2 illustrates a schematic diagram of an MCNC, in accordance with an embodiment of the disclosure.

In embodiments where substantially straight carbon nanotubes 108 are desired, an applied magnetic field may be configured to levitate magnetic particle 101 within a nanotube growth chamber and keep an overall orientation of magnetic particle 101 substantially stable during the growth process. In embodiments where substantially curved carbon nanotubes are desired (e.g., curved carbon nanotubes 208 as shown in FIG. 2), an applied magnetic field may be configured to rotate or spin magnetic particle 101 within a nanotube growth chamber during the growth process. In various embodiments, the length of carbon nanotubes 108 (or 208) may be approximately 200 um and the density of carbon nanotubes 108 may substantially match that of catalyst nanoparticles 106. More generally, the length of carbon nanotubes 108 (or 208) may range between 10 um and 300 um or more and the growth process may be adjusted to produce one of a variety of characteristics of magnetic MCNC 100 and/or a plurality or coating of MCNCs 100, such as overall conductivity, viscosity in a carrier fluid, adhesiveness to polymeric material and/or flow-by particles, and/or other individual or aggregate characteristics, as described herein. For example, the length of time for the growth process may be adjusted to vary the length of carbon nanotubes 108 (or 208), where a longer period of time equates to a longer resulting carbon nanotube structure. Notably, in a coating of MCNCs 100, the primary path of electrical conduction is through direct contact between carbon nanotubes 108 (or 208) of adjacent MCNCs and generally does not require and/or utilize conduction through magnetic particle 101.

FIG. 2 illustrates a schematic diagram of MCNC 200, in accordance with an embodiment of the disclosure. A shown in FIG. 2, MCNC 200 includes magnetic particle 101, magnetic core 102, intermediate layer 104, and catalyst particles 106 shown in FIG. 1, but replaces at least a portion of substantially straight carbon nanotubes 108 with substantially curved carbon nanotubes 208. As noted herein, curved carbon nanotubes 208 may be formed using a CVD growth process while an applied magnetic field rotates magnetic particle 101 in a carrier gas, which can preferentially grow carbon nanotube structures that are curved around the rotational axis in a direction opposite of the applied spin. With appropriate carrier gas pressure and density, the dynamic viscosity of the carrier gas may preferentially grow carbon nanotube structures wherein some length of a number of nanotubes is in contact with some length of other nanotubes. In other embodiments, at least a portion of curved carbon nanotubes 208 may be formed by translating magnetic particle 208 through the carrier gas during the growth process, which can preferentially grow carbon nanotube structures that are curved away from the direction of translation.

By combining different applied spin rotations and/or translations that are applied during the growth process, substantially curved carbon nanotubes 208 may be formed over the entirety of outer surface 105 of magnetic particle 101. More generally, the shape or curvature of carbon nanotubes 208 may be adjusted or selected by controlling a density of the carrier gas in which they are grown, a flow rate of the carrier gas, a flow direction of the carrier gas, and/or a rotation and/or translation rate of magnetic particle 101, as described herein, which can in turn adjust various individual or aggregate characteristics of MCNC 200. In some embodiments, the shape of carbon nanotubes 108/208 may be selected to form an MCNC coating configured to attract and/or bond to particulates and/or solids in a fluid flowing over the surface substantially adjacent to the MCNC coating, as described herein.

Figure 3:
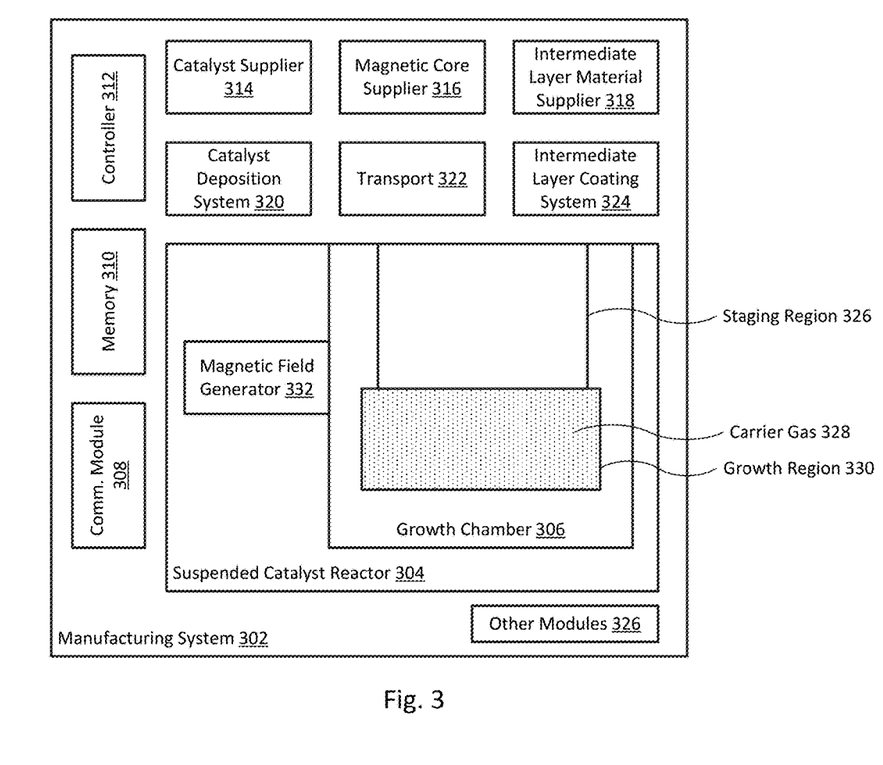
FIG. 3 illustrates a block diagram of an MCNC manufacturing system, in accordance with an embodiment of the disclosure.

FIG. 3 illustrates a block diagram of an MCNC manufacturing system 302, in accordance with an embodiment of the disclosure, which may be configured to manufacture MCNCs 100 or 200 as shown in FIGS. 1 and 2. For example, as shown in FIG. 3, manufacturing system 302 may include catalyst supplier 314, magnetic core supplier 316, and optional intermediate layer material supplier 318 able to supply catalyst nanoparticles, magnetic cores, and intermediate layer materials, respectively, to catalyst deposition system 320, an intermediate layer coating system 324, and/or suspended catalyst reactor 304 using transport 322, which may all be controlled and/or moderated by controller 312 executing software stored and/or supplied by memory 310 and/or communication module 308. In various embodiments, magnetic cores from magnetic core supplier 316 may be converted into magnetic particles (e.g., similar to magnetic particle 101 of FIGS. 1 and 2) using catalyst deposition system 320 and/or intermediate layer coating system 324 and then delivered to suspended catalyst reactor 304 (e.g., similar to a CVD system) where carbon nanotubes are formed on the outer surface of the magnetic particles to form MCNCs 100 and/or 200, as described herein.

Magnetic core supplier 316 may be implemented as a storage area configured to store magnetic cores and deliver them to intermediate layer coating system 324, catalyst deposition system 320, and/or suspended catalyst reactor 304, either directly or through use of transport 322. When present, intermediate layer material supplier 318 may be implemented as a storage area configured to store intermediate layer materials and deliver it to intermediate layer coating system 324, either directly or through use of transport 322. For example, in embodiments where an intermediate layer is desired, intermediate layer material supplier 318 may be configured to supply bulk intermediate layer material to intermediate layer coating system 324, which may be configured to use the bulk intermediate layer material to form intermediate layer 104 over magnetic core 102, for example. Catalyst supplier 314 may be implemented as a storage area configured to store the catalyst material used to form catalyst nanoparticles 106 and deliver the catalyst material to catalyst deposition system 320 either directly or through use of transport 322. For example, in embodiments where the catalyst material is cobalt and/or titanium, catalyst supplier 314 may be configured to supply bulk strips of the catalyst material to catalyst deposition system 320, which may be configured to convert the bulk strips of catalyst material to catalyst nanoparticles that can be formed as seed particles on an outer surface of magnetic particle 101.

Catalyst deposition system 320 may be configured to receive catalyst material from catalyst supplier 314 and magnetic particles from transport 322, convert the catalyst material to catalyst nanoparticles, and adhere or embed or otherwise form catalyst nanoparticles on an outer surface of the magnetic particles. In some embodiments, catalyst deposition system 320 may be implemented as a CVD system similar to suspended catalyst reactor 304, as described herein. In one embodiment, catalyst deposition system 320 and suspended catalyst reactor 304 may be implemented with the same hardware. In other embodiments, catalyst deposition system 320 may be implemented with an ion injection beam or a sputtering or other type of deposition system configured to form catalyst nanoparticles on an outer surface of magnetic particles (e.g., delivered by transport 322) according to a desired surface area density as controlled by controller 312.

When present, intermediate layer coating system 324 may be configured to accept intermediate layer material from intermediate layer materials supplier 318 and magnetic cores from transport 322 and form intermediate layer 104 on the magnetic cores. In some embodiments, intermediate layer coating system 324 may be implemented as a CVD system similar to suspended catalyst reactor 304, and/or intermediate layer coating system 324 and suspended catalyst reactor 304 may be implemented with the same hardware. In other embodiments, catalyst deposition system 320 may be implemented, with a sputtering or other type of deposition system configured to form intermediate layer 104 on magnetic cores (e.g., delivered by transport 322) according to a desired layer thickness as controlled by controller 312. In general, transport 322 may be implemented with one or more mechanical transport mechanisms configured to receive and convey materials, magnetic cores, magnetic particles, and/or MCNCs to and from the various elements or modules of system 302.

As shown in FIG. 3, suspended catalyst reactor 304 includes magnetic field generator 332 and growth chamber 306 (e.g., a CVD growth chamber) configured to form carbon nanotubes 108/208 extending from catalyst nanoparticles 106 by levitating magnetic particles within carrier gas 328 while growing carbon nanotubes 108 or 208 to form MCNCs 100 or 200 under the control of controller 312, as described herein. In various embodiments, growth chamber 306 may include staging region 326 and growth region 330, where growth region 330 is configured substantially to contain and apply carrier gas 328 to magnetic particles delivered to suspended catalyst reactor 304 by transport 322 and levitated within growth region 330 by magnetic field generator 322. By forming MCNCs in this manner, embodiments of the present disclosure provide MCNCs with substantially spherical or sphere-like distributions of carbon nanotubes (e.g., substantially across all of outer surface 105 of magnetic particle 101, which can facilitate formation of reliable electrically conductive coatings on polymeric and/or other material surfaces.

In various embodiments, magnetic field generator 332 may be configured to apply a magnetic field to magnetic particles (e.g., with catalyst nanoparticles, as described herein) delivered to staging region 326, where the magnetic field/magnetic field generator 332 is controlled (e.g., by controller 312) to move the magnetic particles from staging region 326 to growth region 330, to levitate the magnetic particles in growth region 330 and/or carrier gas 328 for a predetermined period of time corresponding to an average desired length of carbon nanotubes to be formed extending from the catalyst nanoparticles on the magnetic particle, and/or to remove the magnetic particles from growth region 330 after the predetermined time. For example, magnetic field generator 332 may be implemented with one or more coils of wire configured to generate a substantially static or oscillating or rotating magnetic field and/or field gradient when DC or AC electrical current is conducted through one or more of the coils, controlled by controller 312. As a specific example, in one embodiment, for a magnetic particle with a 200 nm radius $SmCo_5$ magnetic core and a 20 nm thick $SiO_2$ intermediate layer, a magnetic field gradient dB/dz of 0.066 T/m would be sufficient to levitate the magnetic particle, and similar order of magnitude or smaller strength magnetic fields and/or gradients would be sufficient to rotate, transport, or otherwise manipulate the magnetic particle, even within the flow of a carrier gas, or as a fully constituted MCNC in a carrier fluid, as described more fully herein. In some embodiments, any one or more of such coils may be actuated so that their positions and/or orientations may be adjusted and/or controlled by controller 312 to facilitate levitation, rotation, and/or transport of magnetic particles and/or MCNCs by magnetic field generator 332. As described herein, carrier gas 328 may be configured to supply carbon atoms or ions to form the plurality of carbon nanotubes, where each carbon nanotube is covalently bonded to a catalyst nanoparticle on the outer surface of the magnetic particle.

In some embodiments, the magnetic field/magnetic field generator 332 may be controlled to rotate the magnetic particles in growth region 330 by applying a rotating magnetic field to the magnetic particles (e.g., in addition to the levitating magnetic field) to cause at least a portion of the carbon nanotubes to grow preferentially as curved carbon nanotubes, as described herein. More generally, growth chamber 306 may be configured to control a density, a flow rate, and/or a flow direction of carrier gas 328, and/or magnetic field generator may be controlled to supply a rotation rate of the magnetic particles to select a shape of at least a portion the carbon nanotubes grown within suspended catalyst reactor 304. In some embodiments, the shape of the carbon nanotubes may be selected to form an MCNC coating configured to attract and/or bond to particulates and/or solids in a fluid flowing over the surface substantially adjacent to the MCNC coating.

Controller 312 may be implemented with any appropriate logic device (e.g., processing device, microcontroller, processor, application specific integrated circuit (ASIC), field programmable gate array (FPGA), memory storage device, memory reader, or other device or combinations of devices) or distributed combination of logic devices that may be adapted to execute, store, receive, and/or provide appropriate instructions, such as software instructions implementing a method and/or control loop for manufacturing an MCNC, for example, or using or controlling one or more elements of MCNC manufacturing system 302, such as magnetic field generator 332. Memory 310 may be implemented with one or more machine readable mediums configured to store non-transitory instructions and/or data files, such as control loop data files, for loading into and/or execution by controller 312. Such machine readable mediums may be internal, external, and/or otherwise configured to interface with controller 312. Communications module 308 may be configured to receive non-transitory instructions and/or data or data files from sources remotely located from controller 312 and/or MCNC manufacturing system 302.

In these and other embodiments, controller 312, memory 310, and/or communications module 308 may be implemented with other components where appropriate, such as volatile memory, non-volatile memory, and/or one or more interfaces (e.g., inter-integrated circuit (I2C) interfaces, mobile industry processor interfaces (MIPI), joint test action group (JTAG) interfaces (e.g., IEEE 1149.1 standard test access port and boundary-scan architecture), various types of universal serial bus (USB) interfaces, Bluetooth™ interfaces, WiFi interfaces, and/or other wired and/or wireless interfaces) used to facilitate control of elements of MCNC manufacturing system 302 and/or manufacture of MCNCs. Other modules 326 may include, for example, one or more temperature measurement devices, MCNC inspection devices, magnetic field generators, MCNC reservoirs, environmental control systems (e.g., vacuum, heating, cooling), electrical current supplies, magnet coil actuators, and/or other modules used to facilitate operation of MCNC manufacturing system 302.

Figure 4:
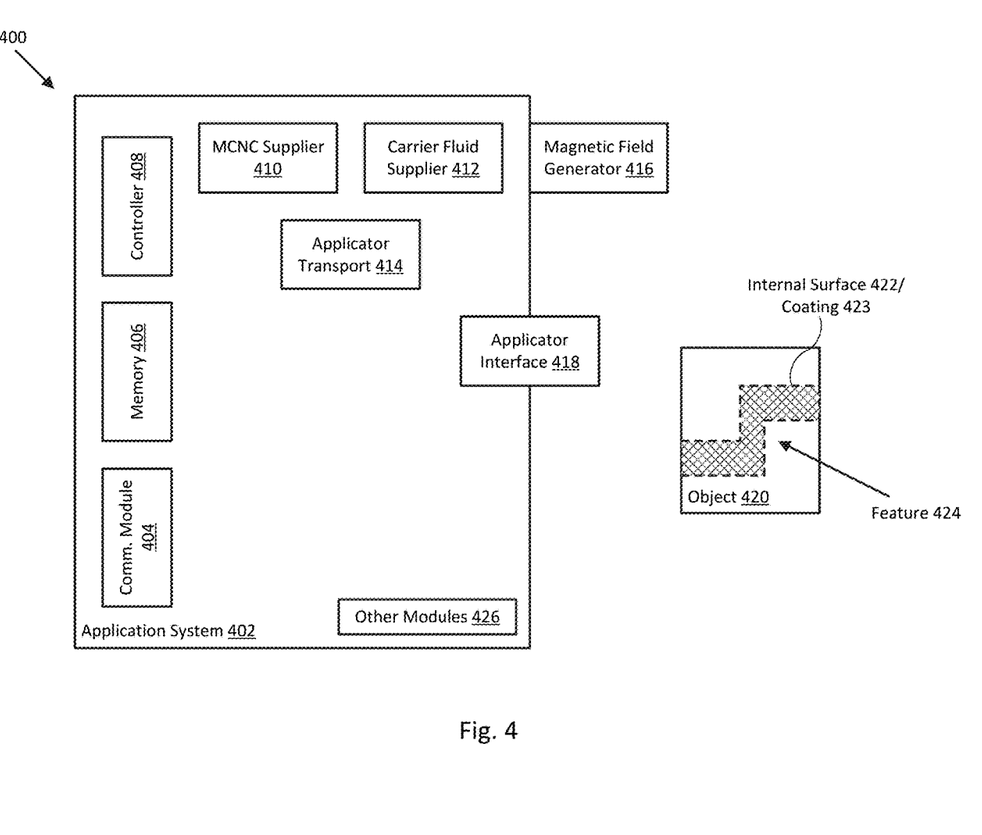
FIG. 4 illustrates a block diagram of an MCNC application system, in accordance with an embodiment of the disclosure.

FIG. 4 illustrates a block diagram of an MCNC application system 402, in accordance with an embodiment of the disclosure, which may be used to apply MCNCs to a surface of an object, as described herein. For example, as shown in FIG. 4, MCNC application system 402 includes MCNC supplier 410 and carrier fluid supplier 412 configured to supply MCNCs (e.g., manufactured by MCNC manufacturing system 302 of FIG. 3) and carrier fluid, respectively, to applicator interface 418 using applicator transport 414, which may all be controlled and/or moderated by controller 408 executing software stored and/or supplied by memory 406 and/or communications module 404. In various embodiments, MCNCs from MCNC supplier 410 may be combined, mixed, or otherwise suspended in carrier liquid from carrier fluid supplier 412 (e.g., by applicator transport 414 and/or other modules 426) and then received by applicator interface 418 (e.g., a pump coupling and/or delivery tubes) where the MCNCs and carrier fluid suspension may be flowed through applicator interface 418 and over a surface of an object (e.g., internal surface 422 of object 420). In various embodiments, MCNC application system 402 includes magnetic field generator 416, which may be controlled (e.g., by controller 408) to apply a magnetic field to the carrier fluid while it is flowing over internal surface 422 to cause the MCNCs in the carrier fluid to form MCNC coating 423 on internal surface 422 of object 420. The resulting MCNC coating 423 may be sufficiently electrically conductive to substantially block formation of a localized electrostatic charge in or on internal surface 422 of object 420 when other fluids or materials are pumped through object 420.

MCNC supplier 410 may be implemented as a storage area configured to store MCNCs and deliver them to carrier fluid supplier 412, applicator interface 418, and/or other modules 426, either directly or through use of applicator transport 414. In some embodiments, MCNC supplier 410 may be configured to store MCNCs and receive and mix carrier fluid from carrier fluid supplier 412 with the stored MCNCs. In some embodiments, MCNC 410 may be implemented by MCNC manufacturing system 302 and/or any subsystem or collection of subsystems of MCNC manufacturing system 302. Carrier fluid supplier 412 may be implemented as a storage area configured to store carrier fluid and deliver it to MCNC supplier 410, applicator interface 418, and/or other modules 426, either directly or through use of applicator transport 414. For example, such carrier fluid may include water, various types of alcohols, various liquid oil compounds, and/or other fluids capable of forming a suspension of MCNCs that is able to flow into complex features 424 of object 420 and be at least partially manipulated by application of an external magnetic field (e.g., supplied by magnetic field generator 416). In general, applicator transport 414 may be implemented with one or more pumps, tubing, valves, and/or other mechanical transport mechanisms configured to convey MCNCs, carrier fluid, and/or combinations/mixtures/suspensions of those to and from the various elements or modules of system 402.

In various embodiments, magnetic field generator 416 may be implemented using techniques and/or systems similar to those described with reference to magnetic field generator 332 of FIG. 3. For example, magnetic field generator 416 may be implemented with one or more coils of wire configured to generate a substantially static or oscillating or rotating magnetic field and/or field gradient when DC or AC electrical current is conducted through one or more of the coils, controlled by controller 408. In some embodiments, any one or more of such coils may be manipulated by a user and/or actuated so that their positions and/or orientations may be adjusted and/or controlled by controller 408 to facilitate guiding the MCNCs in the carrier fluid towards feature 424 and/or a portion of internal surface 422 to form MCNC coating 423 on feature 424 and/or the portion of internal surface 422 by magnetic field generator 332.

For example, internal surface 422 and/or other surfaces of object 420 may include feature 424 that can cause a disturbance in the flow of the carrier fluid over a portion of surface 422 (e.g., at or near feature 424) that might hinder formation of a reliable coating of MCNCs at that portion of surface 422. Magnetic field generator 416 may be used to controllably and reliably form MCNC coating 423 over all portions of internal surface 422 by increasing a density of MCNCs at a particular point or area, by reflowing MCNCs in the carrier fluid over a particular point or area, or by otherwise directing flow of MCNCs over any particular points or areas of internal surface 422. In some embodiments, magnetic field generator 416 may be configured to apply a magnetic field to or near internal surface 422 of object 420 by penetrating the body of object 420 (e.g., the volume outside internal surface 422). In other embodiments, magnetic field generator may be implemented as a probe or other device configured to be inserted within internal surface 422 and apply a magnetic field to surface 422 without requiring object 420 to be substantially permeable to applied magnetic fields.

Applicator interface 418 may be implemented by one or more pumps, fluid couplings, return couplings, and/or delivery/return tubing configured to receive the carrier fluid and MCNC mixture/suspension (e.g., from applicator transport 414) and deliver the carrier fluid and MCNC mixture/suspension to object 420 at a constant or variable flow rate configured to facilitate forming coating 423. In some embodiments, applicator interface may be configured (e.g., with delivery and return lines) to close cycle flow the carrier fluid and MCNC, mixture/suspension through object 420 for a predetermined period of time to help ensure coating 423 is sufficiently electrically conductive (e.g., sufficiently thick and/or continuous over internal surface 422) to substantially block formation of a localized electrostatic charge in or on internal surface 422 of object 420.

Controller 408 may be implemented with any appropriate logic device or distributed combination of logic devices that may be adapted to execute, store, receive, and/or provide appropriate instructions, such as software instructions implementing a method and/or control loop for applying an MCNC coating, for example, using or controlling one or more elements of MCNC application system 402, such as magnetic field generator 416. Memory 406 may be implemented with one or more machine readable mediums configured to store non-transitory instructions and/or data files, such as control loop data files, for loading into and/or execution by controller 408. Such machine readable mediums may be internal, external, and/or otherwise configured to interface with controller 408. Communications module 404 may be configured to receive non-transitory instructions and/or data or data files from sources remotely located from controller 408 and/or MCNC application system 402 (e.g., such as from MCNC manufacturing system 302 and/or elements thereof). In these and other embodiments, controller 408, memory 406, and/or communications module 404 may be implemented using similar techniques or systems used to implement controller 312, memory 310, and/or communications module 308, where appropriate, such as volatile memory, non-volatile memory, and/or one or more interfaces used to facilitate control of elements of MCNC application system 402 and/or application of MCNCs to object 420.

Other modules 426 may include, for example, one or more temperature measurement devices, MCNC coating inspection devices, magnetic field generators, MCNC carrier fluid suspension reservoirs, MCNC and carrier fluid mixers, environmental control systems (e.g., vacuum, heating, cooling), electrical, current supplies, magnet coil actuators, and/or other modules used to facilitate operation of MCNC application system 402. For example, in one embodiment, other modules 426 may include a potentiometer configured to measure a resistance of coating 423 across surface internal 422 of object 420 (e.g., from one end of object 420 to another end of object 420) and supply such measurement to controller 408. In such embodiment, controller 408 may be configured to determine a presence of the MCNC coating 423 sufficient to substantially block formation of a localized electrostatic charge in or on surface 422 of object 420 based, at least in part, on the measured resistance. In some embodiments, controller 408 may be configured to indicate completion of forming MCNC coating 423 and/or a reliability of coating 423 when the measured resistance of coating 423 is below a predetermined value or below a predetermined value per length of surface 422, for example.

In various embodiments, object 420 may be any tubing, coupling, valve, and/or other object including a substantially non-conductive surface (e.g., internal surface 422) that one wishes to make conductive. For example, in a particular embodiment, object 420 may be a polymeric fuel line, coupling, or valve, or such object with a polymeric surface, which may be an internal surface of any of such objects. Feature 424 may be any complex feature of the surface that would typically cause or risk causing a disturbance in flow of a carrier fluid over the feature that could result in a thin, absent, or otherwise unreliable MCNC coating. For example, feature 423 may be a bend in the internal surface of a coupling or valve or tube, such as that shown in FIG. 4. MCNC coating 423 may be a coating of MCNCs formed on internal surface 422, where each MCNC of MCNC coating 423 includes carbon nanotube catalyst nanoparticles 106 formed on outer surface 105 of magnetic particle 101 and carbon nanotubes 108/208 extending from catalyst nanoparticles 106 and formed while magnetic particle 101 is levitated within nanotube growth chamber 306, as described herein.

Figure 5:
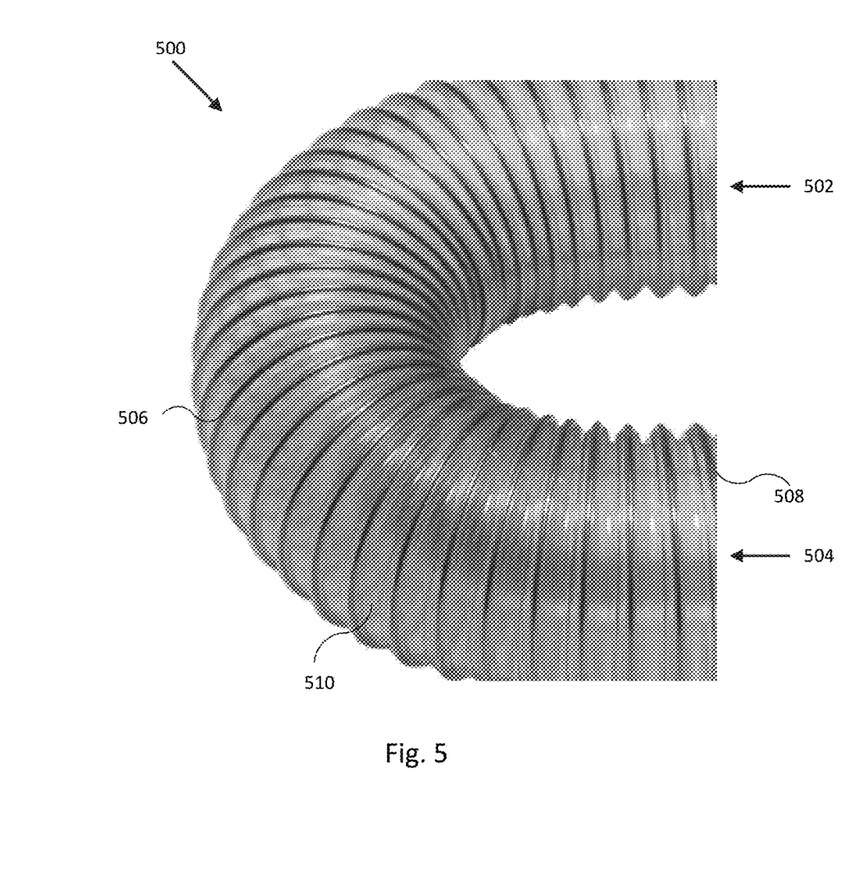
FIG. 5 illustrates a tube coated with MCNCs, in accordance with an embodiment of the disclosure.

FIG. 5 illustrates a tube 500 coated with MCNCs, in accordance with an embodiment of the disclosure. As shown in FIG. 5, in some embodiments, tube 500 may be made substantially of polymeric material and/or include one or more corrugations 506 to help tube 506 keep its volumetric shape without significantly reducing its flexibility. Corrugations 506 may be made entirely of polymeric material (e.g., which may be thickened to increase structural strength) and/or may include various types of support structures, such as metal coils and/or other material support structures. In some embodiments, corrugations 506 may form multiple individual corrugations about a central axis of tube 500, for example, or may form a substantially continuous structure running the length of tube 500, such as a spiral or spring shaped structure. As described herein, corrugations 506 may form complex features on internal surface 508 of tube 500 that are difficult to coat with MCNCs using conventional means. In other embodiments, tube 500 may correspond to, for example, a multi jointed tube with internal pockets (e.g., corresponding to corrugations 506) that are similarly difficult to coat with MCNCs using conventional means. More generally, tube 500 may be made of any material with a non-conductive internal surface 508 (e.g., visible in FIG. 5 through the semi-transparent tube wall of tube 500) to which MCNCs may be made to adhere to form MCNC coating 510. In one specific embodiment, tube 500 may be configured to be used as a fuel line for refueling an aircraft or other vehicle or machine configured to use fuel.

Also shown in FIG. 5 are inlet end 502 and outlet end 504 of tube 500. Inlet end 502 may be coupled or attached to a fuel reservoir (e.g., a fuel truck or fuel station), and outlet end 504 may be coupled to a refueling port for a vehicle, aircraft, or other device that is to be refueled (e.g., aircraft). The electrical conductivity of MCNC coating 510 on surface 508 of tube 500 acts to suppress or eliminate risk of accumulation of electrostatic charge on or within surface 508 (e.g., within tube 500), which in turn suppresses or eliminates risk of electrostatic discharge when coupling tube 500 to a fuel reservoir or refueling port. In various embodiments, the electrical conductivity of MCNC coating 510 may be determined by measuring a resistance across surface 508 from inlet end 502 to outlet end 504, for example. A relatively high resistance, such as approximately $10^{12}$ ohms or higher, may indicate that MCNC coating 510 may not be sufficiently thick or evenly distributed across surface 508, whereas a relatively low resistance, such as approximately $10^3$ ohms or lower, may indicate that MCNC coating 510 is sufficiently electrically conductive across surface 508 to substantially block formation of localized electrostatic charge in or on surface 508 of tube 500. In some embodiments, a sufficiently electrically conductive MCNC coating 510 may be between approximately 0.4 microns and 200 microns in thickness, though thicker or thinner thicknesses are contemplated, which may depend on various characteristics of the individual MCNCs (e.g., such as various physical and electrical characteristics of magnetic particles 101 and/or lengths of nanotubes 108/208) constituting MCNC coating 510.

In some embodiments, MCNC coating 510 may be configured (e.g., by providing MCNCs with selectively shaped carbon nanotubes) to preferentially attract and/or bond to particulates and/or solids in a fluid or fuel flowing within tube 500 and over surface 508, which may act to at least partially filter such debris from the flowing fluid or fuel. Using applied magnetic fields, different types of MCNC coatings (e.g., made from MCNCs with differently shaped carbon nanotubes) may be formed may be applied to different portions of internal surface 508, such as to only form filter coatings near inlet end 502 and outlet end 504, for example.

Figure 6:
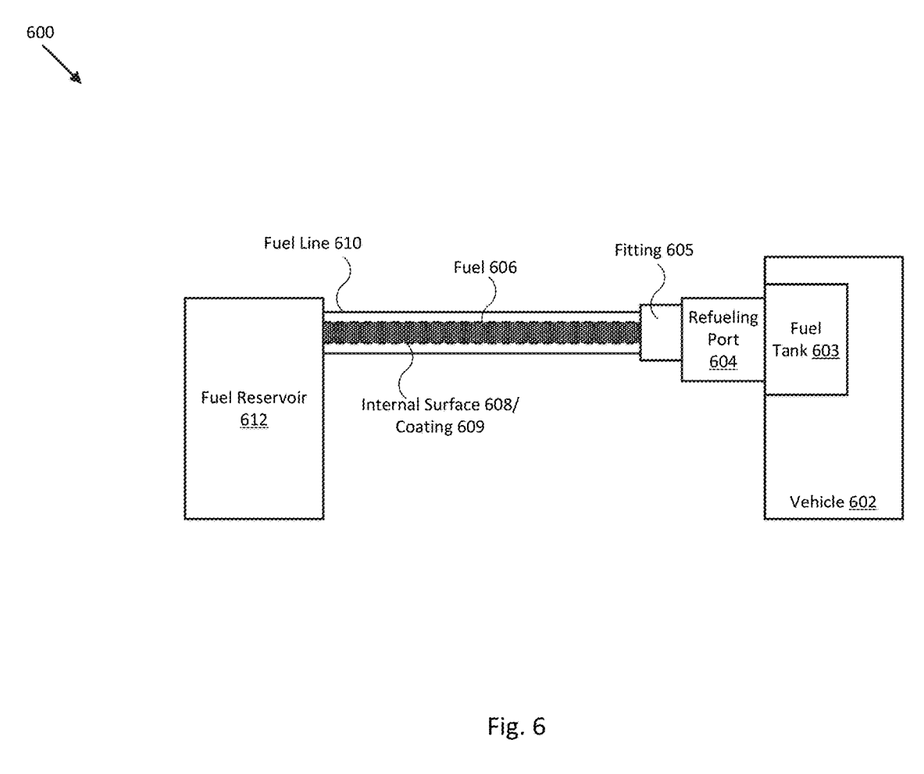
FIG. 6 illustrates a block diagram of a refueling system at least partially coated with MCNCs, in accordance with an embodiment of the disclosure.

FIG. 6 illustrates a block diagram of a refueling system 600 at least partially coated with MCNCs, in accordance with an embodiment of the disclosure. As shown in the embodiment illustrated by FIG. 6, refueling system 600 includes fuel reservoir 612 coupled to vehicle 602 through fuel line 610, fitting 605, and refueling port 604. In various embodiments, fuel reservoir 612 may be a fuel truck or station or similar configured to pump fuel 606 to a fuel tank 603 of an aircraft (e.g., vehicle 602) using a polymeric fuel line (e.g., fuel line 610) having an internal surface 608 coated with MCNCs (MCNC coating 609). While fitting 605 and refueling port 604 are shown in FIG. 6 only on the receiving side of refueling system 600, in other embodiments, similar fittings and/or ports may be included at the interface between fuel reservoir 612 and fuel line 610, such as to facilitate easy replacement or separate storage of fuel line 610. In general, a refueling process would proceed by attaching fuel line 610 to fuel reservoir 612 (if necessary), attaching fuel line 610 to fuel tank 603 through refueling port 604, and securing fuel line 610 to refueling port 604 (e.g., using fitting 605, if necessary), and pumping fuel 606 from fuel reservoir 612 to fuel tank 603 through fuel line 610, wherein MCNC coating 609 is sufficiently electrically conductive to substantially block formation of localized electrostatic charge in or on internal surface 608 of fuel line 610.

In various embodiments, MCNC coating 609 is sufficiently electrically conductive to substantially block formation of a localized electrostatic charge in or on internal surface 608 of fuel line 610. In such embodiments, fitting 605, refueling port 604, fuel tank 603 and/or fuel reservoir 612 may be implemented without grounding equipment (e.g., straps, interfaces, and/or other grounding equipment), which can significantly reduce the weight and/or complexity of design of fitting 605, refueling port 604, fuel tank 603 and/or fuel reservoir 612. For example, fitting 605 and/or refueling port 604 may be implemented as a groundless fitting 605 and/or a groundless refueling port. This is particularly beneficial with aircraft because it can significantly reduce the weight of the aircraft and simplify the refueling procedure used to refuel the aircraft. Moreover, in embodiments where refueling system 600 is an in-air refueling system (e.g., where fuel reservoir 612 is a refueling aircraft and fitting 605 and refueling port 604 are configured to receive fuel line 610, which may be a partially rigid fuel line, during flight), MCNC coating 609 may help significantly reduce the weight of fuel line 610, fitting 605, refueling port 604, and/or other elements of refueling system 600 while increasing the overall safety of the in-air refueling process by substantially blocking formation of a localized electrostatic charge in or on internal surface 608 of fuel line 610, and/or on or within fitting 605, refueling port 604, and/or fuel tank 603 (e.g., if made from or including an internal surface lined with a polymeric material).

Figure 7:
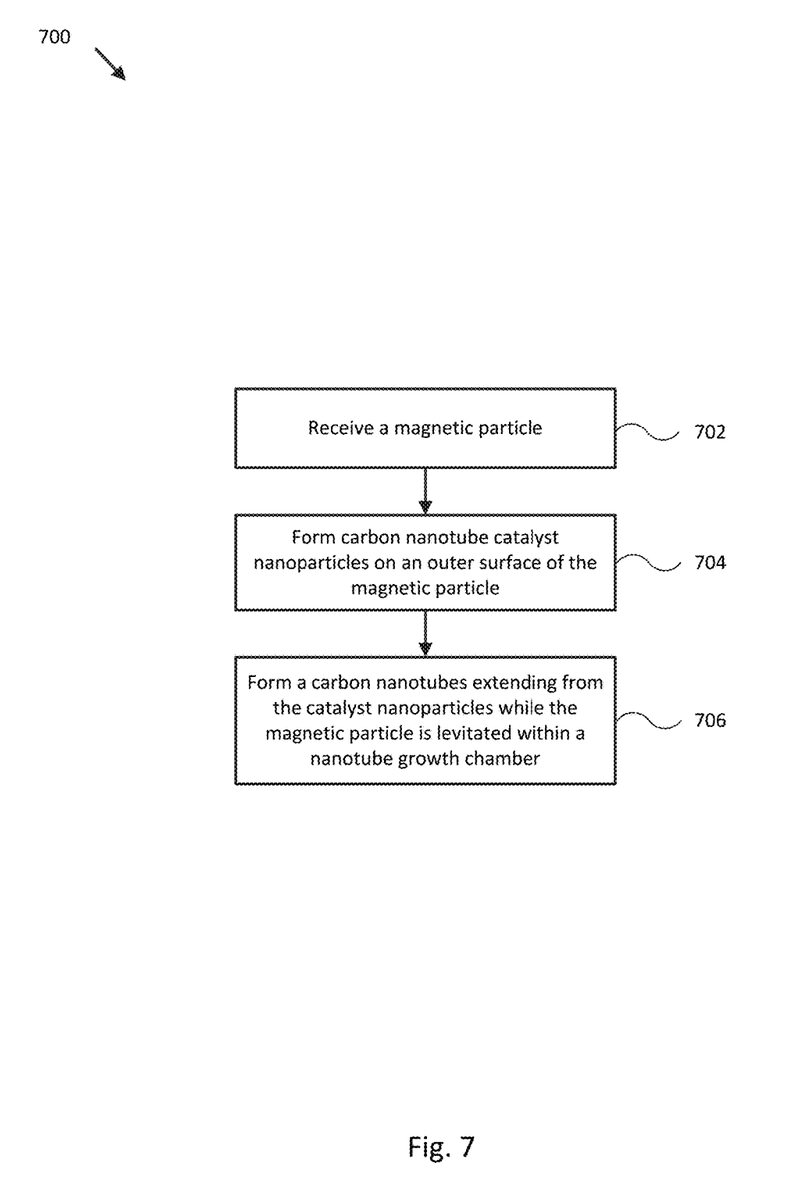
FIG. 7 illustrates a flow diagram of various operations to form MCNCs, in accordance with an embodiment of the disclosure.

FIG. 7 illustrates a flow diagram 700 of various operations to form or manufacture MCNCs, in accordance with an embodiment of the disclosure. The operations of FIG. 7 may be implemented with any combination of software instructions executed by one or more devices associated with corresponding elements of FIG. 3 and/or other electronic devices configured to support process 700. Any step or block of process 700 may be performed in an order or arrangement different from the embodiment illustrated in FIG. 7. For example, in other embodiments, one or more blocks from process 700 may be included in another process and/or otherwise omitted. Although process 700 is described with reference to elements of FIGS. 1-3, process 700 may be performed by other elements and/or systems including a different selection of modules and/or systems.

In block 702, a magnetic particle is received. For example, catalyst deposition system 320 of MCNC manufacturing system 302 may be configured to receive magnetic particle 101 from magnetic core supplier 316 and/or intermediate layer coating system 324 through transport 322. In various embodiments, magnetic particle 101 may be only magnetic core 102, for example, or may include an intermediate layer 104 formed over magnetic core 102 by, for example, intermediate layer coating system 324. In block 704, carbon nanotube catalyst nanoparticles are formed on an outer surface of a magnetic particle. For example, catalyst deposition system 320 of MCNC manufacturing system 302 may be configured to form carbon nanotube catalyst nanoparticles 106 on outer surface 105 of magnetic particle 101, as described herein. In some embodiments, formation of carbon nanotube catalyst nanoparticles 106 (and/or intermediate layer 104, if included) may take place in a common CVD system, such as in suspended catalyst reactor 304. In block 706, carbon nanotubes extending from the catalyst nanoparticles are formed while the magnetic particle is levitated within a nanotube growth chamber. For example, suspended catalyst reactor 304 may be configured to form carbon nanotubes 108/208 extending from carbon nanotube catalyst nanoparticles 106 while magnetic field generator 332 levitates magnetic particle 101 within growth chamber 306. In some embodiments, magnetic field generator may be configured to rotate magnetic particle 101 within growth chamber 306 by applying a rotating or oscillating magnetic field to magnetic particle 101 to cause at least a portion of carbon nanotubes 108/208 to grow preferentially as curved carbon nanotubes 208, as described herein.

Thus, embodiments of the present disclosure provide MCNCs with controllably variable individual and aggregate characteristics, such as overall conductivity, viscosity in a carrier fluid, adhesiveness to polymeric material and/or flow-by particles, and/or other individual or aggregate characteristics, as described herein. Moreover, such MCNCs are provided with substantially spherical or sphere-like distributions of carbon nanotubes, which can facilitate formation of reliable electrically conductive coatings on polymeric and/or other material surfaces.

Figure 8:
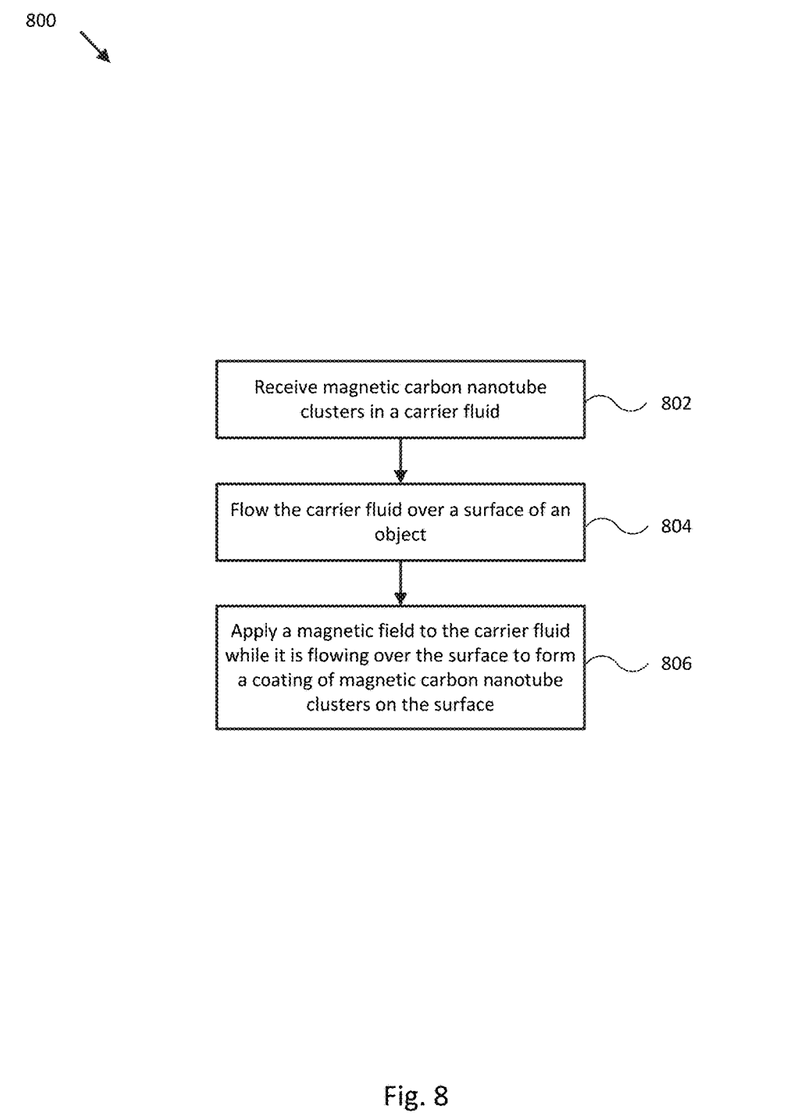
FIG. 8 illustrates a flow diagram of various operations to apply MCNCs to a surface of an object, in accordance with an embodiment of the disclosure.

FIG. 8 illustrates a flow diagram 800 of various operations to apply MCNCs to a surface of an object, in accordance with an embodiment of the disclosure. The operations of FIG. 8 may be implemented with any combination of software instructions executed by one or more devices associated with corresponding elements of FIG. 4 and/or other electronic devices configured to support process 800. Any step or block of process 800 may be performed in an order or arrangement different from the embodiment illustrated in FIG. 8. For example, in other embodiments, one or more blocks from process 800 may be included in another process and/or otherwise omitted. Although process 800 is described with reference to elements of FIGS. 1-4, process 800 may be performed by other elements and/or systems including a different selection of modules and/or systems.

In block 802, MCNCs in a carrier fluid are received. For example, applicator transport 414 (e.g., and/or one or more other modules 426) of MCNC application system 402 may be configured to receive MCNCs 100/200 from MCNC supplier 410 and carrier fluid from carrier fluid supplier 412 and create a combination, mixture, or suspension of the two, and applicator interface 418 may be configured to receive MCNCs 100/200 suspended in the carrier fluid from applicator transport 414 (and/or one or more other modules 426). In block 804, carrier fluid is flowed over a surface of an object. For example, MCNC application system 402 may be configured to flow carrier fluid with MCNCs 100/200 over internal surface 422 of object 420, or over internal surface 508 of tube 500. More generally, MCNC application system 402 may be configured to flow such suspension over any surface of an object in order to facilitate forming a coating of MCNCs over the surface, as described herein.

In block 806, a magnetic field is applied to a carrier fluid while it is flowing over a surface to form a coating of MCNCs on the surface. For example, magnetic field generator 416 may be configured to apply a magnetic field to the carrier fluid suspension while it is flowing over surface 422 to cause the MCNCs in the carrier fluid suspension to form coating 423 on surface 422 of object 420. More generally, MCNC application system 402 may be configured to apply the magnetic field to the carrier fluid suspension while it is flowing over any surface of any object to help create an MCNC coating, such as over internal surface 508 of tube 500 to create MCNC coating 510.

Thus, embodiments of the present disclosure provide reliable electrically conductive coatings for surfaces of objects sufficient to substantially block formation of localized electrostatic charge in or on such surfaces. Moreover, such embodiments are able to form reliable MCNC coatings on the internal surfaces of polymeric tubing used for fuel delivery even when the polymeric fuel line includes complex surface features, as described herein. Refueling systems utilizing such coatings may be designed without conventional grounding equipment and can therefore generally be less complex (and therefore safer to operate) and weigh less than conventional refueling systems.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the scope of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

It will be understood that, although the terms "first," "second," "third," etc., may be used herein to describe various elements, regions, and/or sections, these elements, regions, and/or sections should not be limited by these terms. These terms are used to distinguish one element, region, or section from another element, region, or section. Thus, a first element, region, or section described below could be termed a second element, region, or section, without departing from the spirit and scope of the present invention.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention pertains. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Flaying thus described embodiments of the present disclosure, persons of ordinary skill in the art will recognize that changes may be made in form and detail without departing from the scope of the present disclosure. Thus, the present disclosure is limited only by the claims and their equivalents.

What is claimed is:

1. A method comprising:
receiving a magnetic particle;
forming a plurality of carbon nanotube catalyst nanoparticles on an outer surface of the magnetic particle; and
forming a plurality of carbon nanotubes extending from the catalyst nanoparticles while the magnetic particle is levitated within a nanotube growth chamber to form a magnetic carbon nanotube cluster, wherein the forming the plurality of carbon nanotubes extending from the catalyst nanoparticles comprises controlling a magnetic field generator to levitate the magnetic particles in a growth region of the nanotube growth chamber, and wherein the growth region comprises a carrier gas configured to supply carbon atoms to form the plurality of carbon nanotubes.

2. The method of claim 1, wherein:
the magnetic particle comprises an intermediate layer formed on a magnetic core; and
the intermediate layer comprises a material selected to couple to the plurality of catalyst nanoparticles via a Van der Waals force.

3. The method of claim 1, wherein the magnetic particle comprises a hard magnetic material or a soft magnetic material.

4. The method of claim 1, wherein the outer surface of the magnetic particle is substantially ellipsoidal or spherical.

5. The method of claim 1, wherein the plurality of catalyst nanoparticles comprises titanium, cobalt, iron, molybdenum, nickel, and/or yttrium.

6. The method of claim 1, wherein:
each one of the plurality of carbon nanotubes are covalently bonded to one or more of the plurality of catalyst nanoparticles on the outer surface of the magnetic particle; and
the forming of the plurality of carbon nanotubes extending from the catalyst nanoparticles comprises controlling the magnetic field generator to remove the magnetic particle from the growth region of the nanotube growth chamber after a predetermined period of time corresponding to an average desired length of the plurality of carbon nanotubes.

7. The method of claim 6, further comprising controlling the magnetic field generator to:
rotate the magnetic particle in the growth region by applying a rotating magnetic field to the magnetic particle to cause at least a portion of the plurality of carbon nanotubes to grow preferentially as curved carbon nanotubes.

8. The method of claim 6, further comprising:
controlling a density of the carrier gas, a flow rate of the carrier gas, a flow direction of the carrier gas, and/or a rotation rate of the magnetic particle to select a shape of at least a portion the plurality carbon nanotubes.

9. A plurality of magnetic carbon nanotube clusters each formed according to the method of claim 1.

10. A method of forming a coating of magnetic carbon nanotube clusters (MCNCs) formed according to the method of claim 1, comprising:
receiving a plurality of MCNCs suspended in a carrier fluid;
flowing the carrier fluid over a surface of an object; and
applying a magnetic field to the carrier fluid while it is flowing over the surface to cause the plurality of MCNCs to form a coating on the surface of the object.

11. The method of claim 10, wherein the surface comprises a feature causing a disturbance in the flow of the carrier fluid over a portion of the surface, and wherein the applying the magnetic field to the carrier fluid comprises:
controlling the magnetic field to guide the plurality of MCNCs towards the feature and/or the portion of the surface to form the MCNC coating on the feature and/or the portion of the surface.

12. The method of claim 10, wherein the MCNC coating is sufficiently electrically conductive to substantially block formation of a localized electrostatic charge in or on the surface of the object.

13. The method of claim 10, wherein:
the object comprises a tube; and
the surface comprises an internal surface of the tube.

14. The method of claim 10, further comprising:
measuring a resistance across the surface of the object; and
determining a presence of the MCNC coating sufficient to substantially block formation of a localized electrostatic charge in or on the surface of the object based, at least in part, on the measured resistance.

15. A device comprising:
an object comprising a surface; and
a coating of magnetic carbon nanotube clusters (MCNCs) formed on the surface, wherein each MCNC of the coating of MCNCs comprises a plurality of carbon nanotube catalyst nanoparticles formed on an outer surface of a magnetic particle and a plurality of carbon nanotubes extending from the catalyst nanoparticles and formed while the magnetic particle is levitated within a nanotube growth chamber, wherein the plurality of carbon nanotubes extending from the catalyst nanoparticles are formed by controlling a magnetic field generator to levitate the magnetic particles in a growth region of the nanotube growth chamber, and wherein the growth region comprises a carrier gas configured to supply carbon atoms to form the plurality of carbon nanotubes.

16. The device of claim 15, wherein:
the outer surface of the magnetic particle is substantially ellipsoidal or spherical;
the magnetic particle comprises an intermediate layer formed on a hard magnetic material or a soft magnetic material; and
the intermediate layer comprises a material selected to couple to the plurality of catalyst nanoparticles via a Van der Waals force.

17. The device of claim 15, wherein:
each one of the plurality of carbon nanotubes are covalently bonded to one or more of the plurality of catalyst nanoparticles on the outer surface of the magnetic particle; and
the plurality of carbon nanotubes extending from the catalyst nanoparticles are formed by controlling the magnetic field generator to remove the plurality of carbon nanotubes from the growth region of the nanotube growth chamber after a predetermined period of time corresponding to an average desired length of the plurality of carbon nanotubes.

18. The device of claim 15, wherein:
the object comprises a polymeric fuel line;

the surface comprises an internal surface of the polymeric fuel line;

the internal surface of the polymeric fuel line comprises a feature causing a disturbance in flow of a fluid over a portion of the internal surface of the polymeric fuel line; and the coating of MCNCs is formed on the internal surface of the polymeric fuel line by:
- receiving a plurality of MCNCs suspended in the fluid; and
- controlling a magnetic field applied to the fluid to guide the plurality of MCNCs towards the feature and/or the portion of the surface to form the coating of MCNCs on the feature and/or the portion of the internal surface of the polymeric fuel line.

19. A method of using the device of claim 15, wherein the object comprises a polymeric fuel line for an aircraft and the surface comprises an internal surface of the polymeric fuel line, the method comprising:

attaching the polymeric fuel line to an aircraft fuel tank through a corresponding refueling port; and pumping fuel from a fuel reservoir to the aircraft fuel tank through the polymeric fuel line, wherein the coating of MCNCs is sufficiently electrically conductive to substantially block formation of a localized electrostatic charge in or on the internal surface of the polymeric fuel line.

20. The device of claim 15, wherein the coating of MCNCs is configured to attract and/or bond to particulates and/or solids in a fluid flowing over the surface substantially adjacent to the coating of MCNCs.

* * * * *